United States Patent
Tao et al.

(10) Patent No.: US 10,253,413 B2
(45) Date of Patent: Apr. 9, 2019

(54) THIN FILM DEPOSITION PREPARATION DEVICE AND METHOD

(71) Applicant: UNIVERSITY OF ELECTRONIC SCIENCE AND TECHNOLOGY OF CHINA, Chengdu (CN)

(72) Inventors: Bowan Tao, Chengdu (CN); Jie Xiong, Chengdu (CN); Fei Zhang, Chengdu (CN); Chaoren Li, Chengdu (CN); Xiaohui Zhao, Chengdu (CN); Yanrong Li, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/121,045

(22) PCT Filed: Apr. 30, 2015

(86) PCT No.: PCT/CN2015/077941
§ 371 (c)(1),
(2) Date: Aug. 24, 2016

(87) PCT Pub. No.: WO2015/188668
PCT Pub. Date: Dec. 17, 2015

(65) Prior Publication Data
US 2017/0191163 A1 Jul. 6, 2017

(30) Foreign Application Priority Data
Jun. 8, 2014 (CN) .......................... 2014 1 0250562

(51) Int. Cl.
*C23C 16/46* (2006.01)
*C23C 16/56* (2006.01)
(Continued)

(52) U.S. Cl.
CPC .............. *C23C 16/46* (2013.01); *C23C 14/08* (2013.01); *C23C 14/24* (2013.01); *C23C 14/541* (2013.01);
(Continued)

(58) Field of Classification Search
CPC .................................. C23C 16/46; C21D 9/62
See application file for complete search history.

(56) References Cited

U.S. PATENT DOCUMENTS 3,525,847 A * 8/1970 Dudek ..................... C21D 1/40
219/120
2008/0187648 A1 * 8/2008 Hart ....................... B01J 23/745
427/8

(Continued)

FOREIGN PATENT DOCUMENTS

| CN | 1377989 A | 11/2002 |
|---|---|---|
| CN | 101629283 A | 1/2010 |
| CN | 104046963 A | 9/2014 |

OTHER PUBLICATIONS

Kobayashi, Applied Physics letters 102, 023112 (2013).*

*Primary Examiner* — Joel G Horning
(74) *Attorney, Agent, or Firm* — Gokalp Bayramoglu

(57) ABSTRACT

The invention provides a thin film deposition system and a method, and relates to the field of thin film deposition. The deposition method comprises the following steps: 1) heating metal substrate; carrying out deposition. The method is characterized in the step 1) that a current is conducted into the metal substrate at one end of the growth zone by one electrode, and out of the metal substrate at the other end of the growth zone by the other electrode, so that the metal substrate is heated by the heat emitting of the resistant of the metal substrate itself. According to the method, the quality of the prepared thin film is improved, while the preparation cost of the thin film is reduced. In addition, the consistent (Continued)

double-sided thin films can be easily prepared on two surfaces of the metal substrate by employing the system and method.

18 Claims, 15 Drawing Sheets

(51) Int. Cl.
*C23C 14/24* (2006.01)
*C23C 14/08* (2006.01)
*C23C 14/54* (2006.01)
*C23C 14/56* (2006.01)
*C23C 16/40* (2006.01)
*C23C 16/54* (2006.01)

(52) U.S. Cl.
CPC ............ *C23C 14/562* (2013.01); *C23C 16/40* (2013.01); *C23C 16/545* (2013.01); *C23C 16/56* (2013.01)

(56) References Cited

U.S. PATENT DOCUMENTS

| 2009/0252893 A1 | 10/2009 | Ozaki et al. |
| 2010/0264129 A1* | 10/2010 | Ishiguro ................... C21D 1/34 |
| | | 219/546 |
| 2014/0033976 A1 | 2/2014 | Sferlazzo |

* cited by examiner

THIN FILM DEPOSITION PREPARATION DEVICE AND METHOD

FIELD OF THE INVENTION

The invention relates to the fabrication of thin films, especially those on the static or moving long metal tape substrates.

BACKGROUND OF THE INVENTION

In the field of thin film fabrication, the substrate generally needs to be heated to control the growth of the thin film, thereby adjust the physical and chemical properties of the film. The conventional heating methods are as the followings: (1) Heating through thermal conduction. Namely, the substrate is pasted to a thermal source and the heat is directly transferred from the thermal source to the substrate. This heating method requires that the substrate is closely contacted to the thermal source to assure the uniform and consistent conduction of the heat. Consequently, there are two shortcomings of this heating method. One is that the size of the substrate can't be too large in order to avoid the inhomogeneous heating resulting from the poor contact between substrate and thermal source. The other is that it's complicated to achieve the specific motion of the large-size substrate in order to fabricate large-scale uniform thin film; (2) Heating through thermal radiation. Namely, the substrate is placed in the radiation range of a high-temperature source (the resistive wires, halogen lamps, etc.) and heated through absorbing the rays (main the infrared ray) generated by the source. It requires that the amount and distribution of the high-temperature source should be carefully considered to achieve the high enough and uniform temperature in the substrate. Compared to method (1), the advantage of this method is that the substrate can be free and be of larger size, while the disadvantage is that the high-temperature source is more difficult to design and needs more space; (3) Heating by induction. Namely, the substrate is placed in the high-frequency electromagnetic field, which can induce a current with same frequency in the substrate, and then heated by the Joule effect. Compared to method (1) and (2), it's a shortcoming that the substrate used in this method must be conductive and be of regular shape and uniform resistivity. In addition, this manner raises much higher requirements on the high-frequency source and the electromagnetic shielding of the setup to prevent the electromagnetic field from harming the surrounding human bodies and electronic devices. However, it's superior to heat the substrate fast and can achieve the substrate surface temperature of 800~1000° C. in a few seconds.

Although the above heating methods are of their own merits and drawbacks, it's same that the energy used for heating substrate is transferred from other high-temperature objects or transformed from other forms of energy. During the transferring or transforming process, only a small part of the energy is practically utilized to heat substrate and the rest part of the energy is wasted by the thermal objects or the electric source themselves. To prepare the thin film on long and thin metal tape, the above heating method (1) is improper because such metal tape is flexible, especially for the moving metal tape. Although the heating method (2) can be applied to heat this kind of metal tape substrate, the design of the thermal source, such as its amount and distribution, should be carefully considered to achieve the uniform distribution of the temperature along the metal tape length and width. Generally, the design is complicated. If the heating method (3) is applied, the frequency should be high enough to restrict the skin effect, thereby improve the energy efficiency. In addition, the plasma would be easily stimulated in the vacuum chamber under the coupling effect of high-frequency electrical field at the state of high frequency. Consequently, the temperature can't be accurately controlled under the simultaneous action of the induction heating and the plasma. Compared with the above three heating methods, it is much simpler and more energy-efficiency to heat the metal tape substrate by the Joule heat generated from itself. In detail, a current supplied by a power source is conducted into the metal tape substrate and the Joule heat will be generated because of the resistant of the metal tape itself, thereby the metal tape is heated. To date, several similar heating methods have been reported in the patents (CN ZL01110150.4 and US 20140033976A1) to heat such metal tape. In patent CN ZL01110150.4, the current flows into and out of the metal tape through electrodes which are quite tightly contacted to the surface of the tape ends, thus this manner can only be used to heat static metal tape. In patent US 20140033976A1, the current is conducted into another metal tape rather than the tape needing to be coated. Therefore, the metal tape substrate is still heated through absorbing the radiation of other thermal metal tape, which is same with heating method (2) and is certainly of the drawbacks of heating method (2). Furthermore, the heating manner in US 20140033976A1 is also inconvenient to simultaneously deposit thin films on both faces of the metal tape substrate.

Hence, this invention proposes the following novel heating method and system to heat flexible metal tape substrate, concerning the drawbacks of the existing heating methods.

SUMMARY OF THE INVENTION

The invention herein intends to solve the technical problem that is how to achieve the simple, energy-efficiency and uniform heating of the static or moving metal tape.

The technical scheme to solve the above technical problem is the thin film deposition system comprising a growth chamber, two rotation shafts for substrate payout and take-up rolls, and a substrate-heating setup. The characters of the thin film deposition system are as the followings: the substrate-heating setup herein comprises two electrode configurations, the first and the second electrode configuration, which are side by side installed between the two rotation shafts in the growth chamber; And the space between the two electrode configurations is the growth zone of the thin film;

The first electrode configuration consists of an interface to current source and at least two substrate-contacting electrode strips. The substrate-contacting electrode strips are distributed along two sides of the substrate passage and electrically connected with each other as well as the current source.

The second electrode configuration also consists of an interface to current source and at least two substrate-contacting electrode strips. The substrate-contacting electrode strips are distributed along two sides of the substrate passage and electrically connected with each other as well as the current source.

In addition, the first electrode configuration consists of a current-distributing circuit and at least two electrode units, each of which includes two substrate-contacting electrode strips settled along two sides of the substrate passage. And the electrode unit connects electrically with each other by the current-distributing circuit.

The second electrode configuration also consists of a current-distributing circuit and at least two electrode units, each of which includes two substrate-contacting electrode strips settled along two sides of the substrate passage. And the electrode unit connects electrically with each other by the current-distributing circuit.

Furthermore, the above-mentioned first electrode configuration includes at least three electrode units, and the current-distributing circuit is the serially connected resistors. Each of the electrode unit is in parallel connection with the adjacent resistor. And the second electrode configuration is same with the first one.

The settlement configuration of the electrode herein includes position-adjusting configurations.

In detail, there are two settlement configurations, namely the first and the second settlement configuration, used for setting up the first and the second electrode configuration, respectively. The first settlement configuration consists of screws and two parallel and insulated plates. The two insulated plates are settled in the growth chamber by the screws, and the space between the two plates is left as the substrate passage. The above-mentioned position-adjusting configuration is connected to the plates. And the second settlement configuration is same with the first one.

Each settlement configuration includes one position-adjusting configuration, which consists of at least three screws, screw nuts and springs. The screws pass through the holes on the insulated plates and make the plates face to face with each other. The coupling of the screws and the holes is a slip fit. The screw nuts are settled on the part of the screws outside the insulated plates, and the springs are settled between the outside surfaces of the insulated plates and the screw nuts. And the substrate-contacting electrode strips are fixed on the inner surfaces of the insulated plates.

There are positioning setups at the entrance and exit of the electrode configuration, and supporting rollers between the roll (the payout or take-up roll) and the adjacent electrode configuration.

One or more extra electrode configurations can also be installed between the first and second electrode configuration. The extra electrode configuration consists of at least two substrate-contacting electrode strips distributed along two sides of the substrate passage and an interface to current source, and is settled in the growth chamber through its settlement configuration. The growth zone of the thin film locates between the two adjacent electrode configurations.

The invention herein also provides a method for preparing thin films, including the following steps: 1) metal substrate heating, 2) thin film deposition. The method is characterized in the step 1) that the current flows into the metal substrate through the electrode beside one end of the growth zone and flows out of the metal substrate through another electrode beside the other end of the growth zone, and the metal substrate is heated by the Joule effect because of the resistant of the metal substrate itself. Noteworthily, the current flows into and out of the metal substrate through its edges.

Compared to the conventional methods of heating metal substrate, the invention herein is simpler in the principle and configuration, and can be employed to heat either the bare metal tape or the oxide-buffered metal tape no matter whether the oxide buffers are conductive. The invention herein can also achieve the sectional heating of the metal tape no matter whether the metal tape is moving or static. The metal tape can be fast heated to 800° C. or above with applying the invention, and the temperature along the tape is uniform. And this uniform temperature zone can be easily adjusted. The invention herein has high energy efficiency, and can also achieve the continuous and reel-to-reel fabrication of multi-layer thin films. The above-mentioned advantages of the invention herein is especially important to industrial fabrication of thin films, and can improve the quality of the fabricated films, as well as decrease the fabrication cost. Furthermore, the simultaneous and uniform fabrication of double-sided films on both surfaces of the metal tape can also be easily achieved by the invention herein, which is important to improve the use factor of the metal tape and the performance, as well as to decrease the cost.

BRIEF DESCRIPTION OF THE DRAWINGS

The invention herein will be better understood when read in conjunction with the following appended drawings, in which same numeral indicates same configuration. It should be noted that these drawings are only used to illustrate the principle of the invention, thus the inventive concepts should not be limited to the precise arrangements and setups depicted in the drawings.

In the above figures, numerals indicate different objects or configurations: 1. ceramic plate, 2. conductive metal strip, 3. spring, 4. headless screw, 5. screw, 6. conductive wire, 7.

current-distributing resistor, 8. metal tape substrate, 9-10. current source, 11. growth zone of thin film, 12. electrode configuration, 13. roll, 14. insulated cover of the roll, 15. rotation shaft of the roll, 16. positioning setup of the substrate, 17. stick to fix the positioning setup, 18. growth chamber, 19. supporting roller, 20. deposition source, 21. precursor-coating zone, 22. precursor-processing zone.

DETAILED DESCRIPTION

The invention herein proposes a method for preparing thin films, including the following steps: 1) metal substrate heating, 2) thin film deposition. The method is characterized in the step 1) that the current flows into the metal substrate through the electrode beside one end of the growth zone and flows out of the metal substrate through another electrode beside the other end of the growth zone, and the metal substrate is heated by the Joule effect because of the resistant of the metal itself. Especially, the current flows into and out of the metal substrate through its edges. And the current may be direct current or alternating current.

The invention herein also provides a system for thin film deposition, shown in FIG. 1-9.

The system is composed of a growth chamber 18, two substrate-rolling setups and substrate-heating setup. The substrate-heating setup herein consists of the first electrode configuration 12A and the second electrode configuration 12C, which are installed side by side between the rolls of 13A and 13B in the growth chamber 18; and the rolls of 13A and 13B are installed through two rotation shafts; the thin film growth zone is located between the two electrode configurations, 12A and 12C.

The first electrode configuration 12A consists of an interface to current source 10 (in FIG. 1) and at least two conductive metal strips 2, which are distributed along two sides of the substrate passage and electrically connected with each other as well as the current source 10.

The second electrode configuration 12C is same with the first electrode configuration 12A.

Figure 1A:
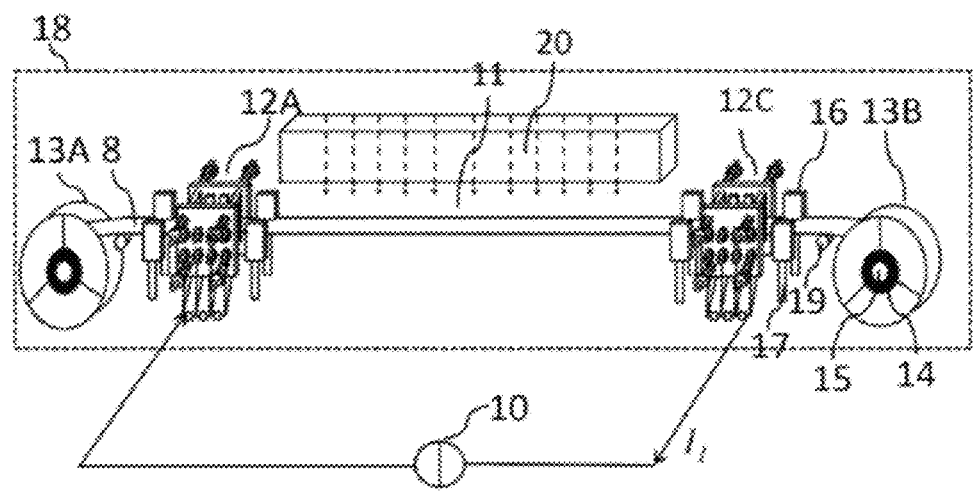
FIG. 1A illustrates the 3D structure and circuit of the embodiment 1 of the invention herein.
Figure 1B:
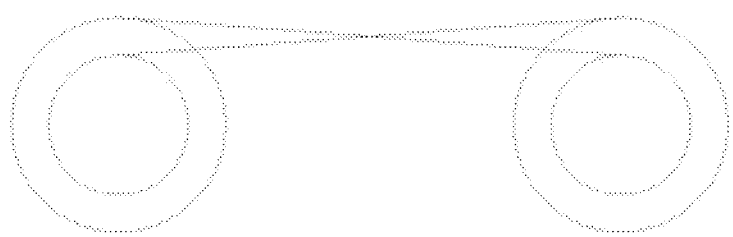
FIG. 1B illustrates the position variation of the substrate passage with the metal tape remnant in the roll.
Figure 1C:
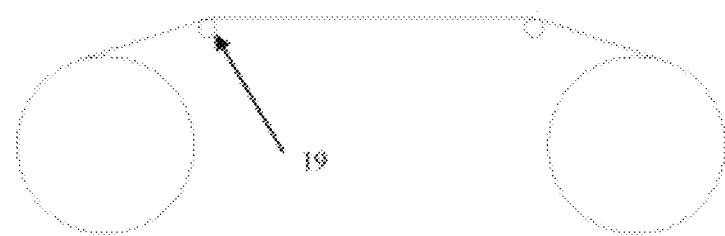
FIG. 1C illustrates that the position of the substrate passage is constant under the effect of the supporting rollers.
Figure 7:
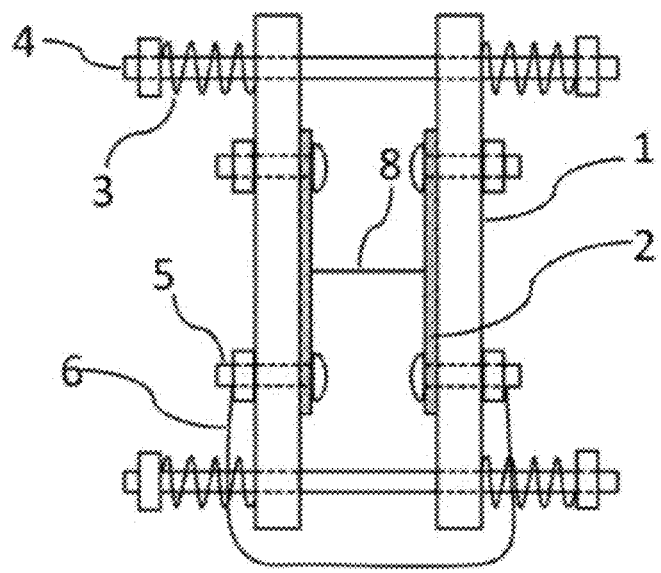
FIG. 7 is right elevation view of the electrode configuration shown in FIG. 5.

The above-mentioned substrate passage is the position or the moving path of the substrate at the working state. If there are no supporting rollers 19, the substrate passage is determined by the movement scope of the substrate due to the variation of the amount of the substrate in the roll, and is illustrated in FIGS. 1B and 7. However, the substrate edges always move in a plane due to the parallel installation of the rotation shafts 15, therefore the conductive metal strips 2 are fixed perpendicular to the substrate passage to keep them closely contact to the substrate edges. As an improvement showed in FIG. 1C, two extra supporting rollers 19 are added to determine the only substrate passage, which are the plane containing the top edges of the rollers 19.

The first electrode configuration 12A consists of current-distributing circuit and at least two electrode units, each of which includes two conductive metal strips settled along two sides of the substrate passage. And the electrode unit connects electrically with each other by the current-distributing circuit. The second electrode configuration 12C is same with that 12A.

Figure 1D:
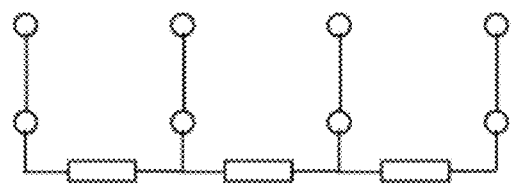
FIG. 1D illustrates the current-distributing circuit of the electrode configuration referred in the invention herein.

The above-mentioned current-distributing circuit is composed of resistors 7 and conductive wires 6, showed in FIG. 1d. For example, the first electrode configuration 12A includes at least three electrode units and current-distributing circuit composed of serially connected resistors 7. Each electrode unit is in parallel connection to the adjacent resistor 7, and the current flowing into each electrode unit is determined by the resistant of those resistors 7.

And one resistor 7 is enough if there are only two electrode units in the first electrode configuration 12A.

The electrode configuration is installed through settlement configuration. Taking an example in FIG. 5-7, the first settlement configuration consists of headless screws and two parallel and insulated plates. The two insulated plates are settled in the growth chamber through the screws, and the space between the two plates is the substrate passage. In addition, a position-adjusting configuration is connected to the plates. And the position-adjusting configuration consists of at least three screws, screw nuts and springs. The screws pass through the holes on the two insulated plates and make them face to face with each other. The coupling of the screws and the holes is a slip fit. The screw nuts are settled on the part of the screws outside the insulated plates, and the springs are installed between the outside faces of the insulated plates and the screw nuts. The conductive metal strips are fixed on the inner faces of the insulated plates.

As an improvement, there are positioning setups 16 installed at the entrance and exit of the electrode configuration, showed in FIGS. 1A, 2-4, 8 and 9. The positioning setup herein consists of two face-to-face positioning plates, on each of which there is a concavity to determine the substrate position. Under the effect of the positioning setup, the up-and-down motion of the metal substrate is mitigated or eliminated, thereby the close contact between substrate and electrode configuration is achieved.

Embodiment 1

As what is shown in FIG. 1, the embodiment 1 comprises a growth chamber 18, two rotation shafts 15 of substrate rolls and substrate-heating setup. The substrate-heating setup herein consists of the first electrode configuration 12A and the second configuration 12C, which are settled side by side between the rolls 13A and 13B in the growth chamber 18; and the rolls 13A and 13B are installed by the two rotation shafts 15; the thin film growth zone 11 is located between the two electrode configurations, 12A and 12C.

The electrode configurations, 12A and 12C, are same with each other.

The first electrode configuration 12A consists of an interface to current source 10 and at least two conductive metal strips 2, which are distributed along two sides of the substrate passage and electrically connected with each other as well as the current source 10. The first electrode configuration 12A is installed in growth chamber 18 through the first settlement configuration.

The first settlement configuration herein consists of two face-to-face and parallel insulated ceramic plates 1, which are skewered by headless screws 4 located at the corners of the ceramic plates 1. The headless screws 4 can be fixed directly or through a holder to the wall of the growth chamber 18.

The ceramic plates 1 can slip along the headless screws 4. There are springs 3 between ceramic plates 1 and screw nuts. There are two or more equal-spaced and parallel conductive metal strips 2 fixed on the inner faces of the two ceramic plates 1 through the screws 5. And the two face-to-face metal strips 2 are connected by a conduction wire 6 to form a pair, which is closely and elastically contacted to metal tape 8 by adjusting the compression of the springs 3. Because of the resistant of the metal tape 8 several current-distributing resistors 7 are in parallel connection with the pairs of the metal strips 2 to uniformly allocate the current flowing into each pair of metal strips 2. The resistant of each resistor 7 is determined by the properties of metal tape 8, number of the metal strip pair, and interspace between two adjacent pairs of metal strip 2. The number of resistor 7 is determined by the number of metal strip pair.

Figure 8:
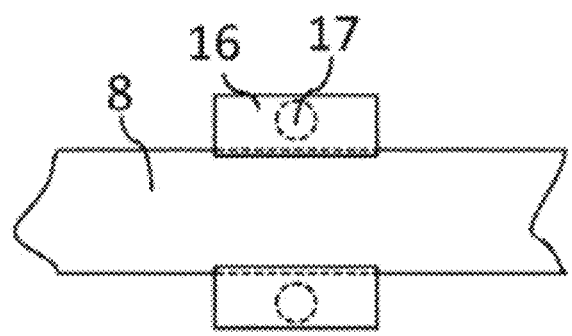
FIG. 8 is the top down view of the positioning setup referred in the invention herein.
Figure 9:
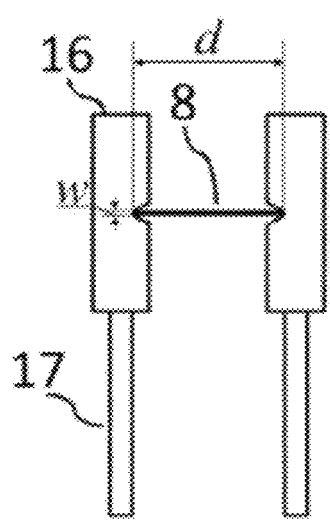
FIG. 9 is the right elevation view of the positioning setup referred in the invention herein.

In FIGS. 1, 8 and 9, there is one positioning setup 16 on each side of the electrode configuration. The positioning setup 16 herein is fixed in the growth chamber 18 by a stick 17 and also insulated to the growth chamber 18. The positioning setup 16 consists of two face-to-face positioning plates located at two sides of the metal tape 8, respectively. On each of the positioning plate there is a trapezoidal tank to position the metal tape 8 to prevent scraping its surface. The bottom width w of the trapezoidal tank is a little larger than the thickness of the metal tape 8. The interspace d between the bottoms of the two face-to-face trapezoidal tanks on the two positioning plates is adjustable and consistent with the width of metal tape 8.

As what is shown in FIG. 1, at working state the embodiment 1 herein is installed in growth chamber 18. The first electrode configuration 12A and the second electrode configuration 12C is connected to anode (or cathode) and cathode (or anode) of the current source 10, respectively. The thin film growth zone 11 is located between the two electrode configurations. There is deposition source 20 directly above the surface of the metal tape 8 in the growth zone 11. The deposition source 20 can originate from coating techniques such as sputtering, pulsed-laser deposition, evaporation, chemical vapor deposition, and so on. The positioning setup 16 is fixed in the growth chamber 18 by the sticks 17 and insulated with the growth chamber 18. The rolls 13 are installed on the rotation shafts 15 driven by an electric motor. An insulated cover 14 is inserted between the roll 13 and rotation shaft 15 to keep the roll 13 insulated with the growth chamber 18. The metal tape 8 is fed by the roll 13B, and passes through the positioning setup 16 on the right side of the second electrode configuration 12C, and is limited into the trapezoidal tanks, which are adjusted to parallel and be level with each other, and the interspace between which is adjusted to be consistent with the width of the metal tape 8. Then, the metal tape 8 successively passes through the second electrode configuration 12C and the positioning setup 16 on the left side of the second electrode configuration 12C, and is limited into the trapezoidal tanks. Next, the metal tape 8 goes through the growth zone 11, then successively passes through the positioning setup 16 on the right side of the first electrode configuration 12A, the first electrode configuration 12A, and the positioning setup 16 on the left side of the first electrode configuration 12A in a same way, and is finally taken up by the roll 13A. When the metal tape 8 is going through the electrode configuration, the metal strips 2 on the inner faces of the two ceramic plates 1 clamp two edges of the metal tape 8 with the surfaces of metal strips perpendicular to the metal tape 8 surfaces. The pressure of the ceramic plates clamping the metal tape 8 is controlled by adjusting the compression of the springs 3 to ensure that the metal strips 2 have excellent electrical contacts with the edges of the metal tape 8. Meanwhile, the positioning effect of the positioning setups 16 that keeps the metal strips 2 always orthogonally contact to the metal tape 8 further ensures the heating reliability. The heating current $I_1$ flows from the anode of the current source 10 to the first electrode configuration 12A, then is uniformly allocated into every pair of the metal strips 2 by the current-distributing resistors 7. The allocated current is then converged through the edges of metal tape 8 into the metal tape 8. Because the metal tape 8 is insulated with the deposition system, the converged current $I_1$ will transmit only in the part of the metal tape 8 located in the growth zone 11, then flows back to the cathode of current source 10 through the second electrode configuration 12C in a same way. The part of the metal tape 8 in the growth zone 11 is heated under the effect of the current $I_1$, and the required surface temperature can be achieved by adjusting the current or voltage of the current source 10. Afterward, the thin film can be formed on the heated metal tape 8 under the effect of the deposition source 20. At the same time, the rotation shaft 15 will drive the roll to rotate, thereby brings the movement of the metal tape 8 between two electrode configurations 12 to realize the continuous and reel-to-reel deposition of single-sided thin film on metal tape 8.

Embodiment 2

Figure 2:
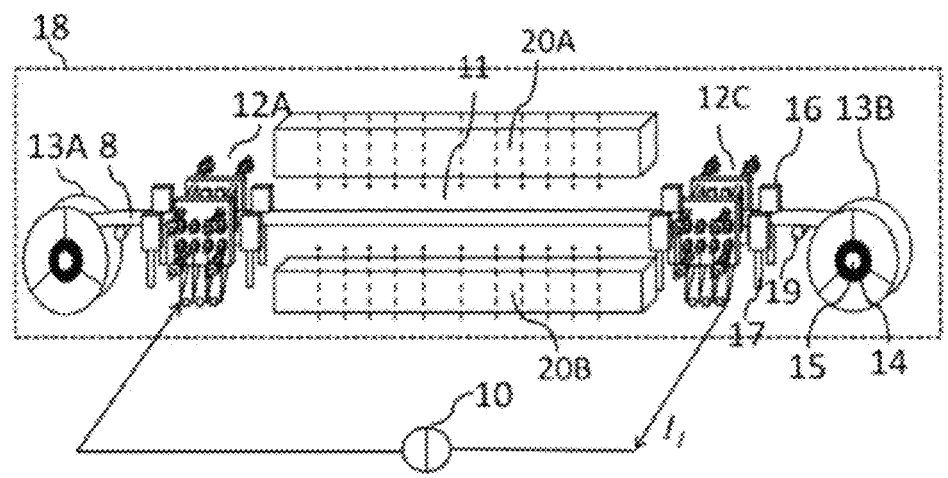
FIG. 2 illustrates the 3D structure and circuit of the embodiment 2 of the invention herein.

As what is shown in FIG. 2, at wording state the substrate-heating setups and metal tape 8 are settled by referring to the embodiment 1. However, there is difference that there are deposition sources over both faces of the metal tape 8 in the growth zone 11 in the embodiment 2, therefore simultaneous deposition of double-sided thin films on both faces of metal tape 8 can be achieved. With the assistance of the movement of metal tape 8, the continuous and reel-to-reel deposition of double-sided thin films on metal tape 8 can be realized.

Embodiment 3

Figure 3:
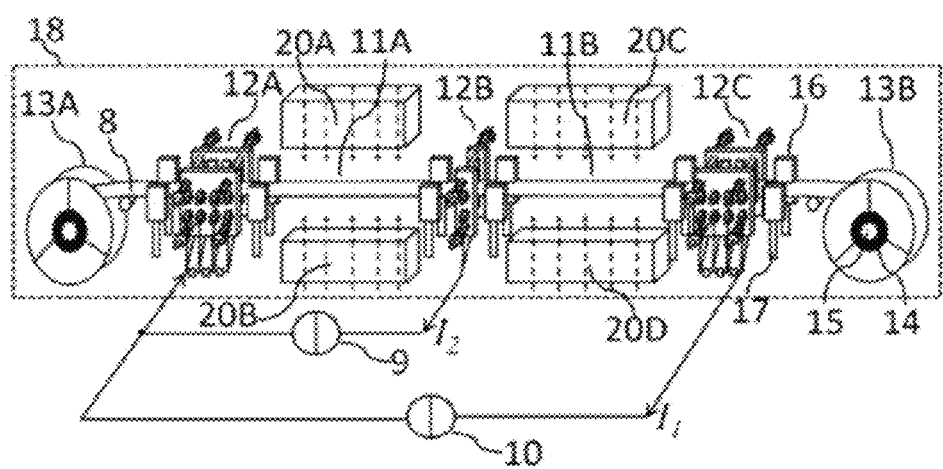
FIG. 3 illustrates the 3D structure and circuit of the embodiment 3 of the invention herein.

As what is shown in FIG. 3, at wording state the substrate-heating setups and metal tape 8 are settled by referring to the embodiment 1. However, the difference between embodiment 1 and 3 is that one extra electrode configuration 12B is installed between the two electrode configurations, 12A and 12C, therefore there are two growth zones, 11A and 11B, in which there are four deposition sources 20A, 20B, 20C and 20D over both faces of the metal tape 8. The first electrode configuration 12A is connected to the anodes (or cathodes) of the current source 9 and 10, and the extra electrode configuration 12B and the second electrode configuration 12C are connected to the cathodes (or anodes) of current source 9 and 10, respectively. The heating current $I_1$ and $I_2$ flow from the anodes of current sources 9 and 10 to the first electrode configuration 12A, and then converged into metal tape 8. The converged $I_1+I_2$ will transmit only in the part of metal tape 8 located in the growth zone 11A, then the $I_2$ flows back to the cathode of current source 9 through the extra electrode configuration 12B, while $I_1$ will transmit in the part of the metal tape 8 in the growth zone 11B and then flows back to the cathode of current source 10 through the second electrode configuration 12C. The part of the metal tape 8 in the growth zone 11 is heated under the effect of the current, and the required surface temperature can be achieved by adjusting the current or voltage of the current source 9 and 10. The surface temperature of the metal tape 8 in deposition zone 11A will be higher than that of the metal tape 8 in deposition zone 11B because the current transmitted in the metal tape 8 in the growth zone 11A is $I_1+I_2$, larger than that $I_1$ in the metal tape 8 in the deposition zone 11B, meaning that the sectional heating of the metal tape 8 is achieved. The temperature gradient between the deposition zone 11A and 11B can be adjusted by the current $I_2$ of current source 9. At the same time, the rotation shaft 15 will drive the roll 13 to rotate, thereby brings the movement of the metal tape 8 among the three electrode configurations 12 to realize the continuous and reel-to-reel deposition of multilayer thin films on both faces of the metal tape 8.

Embodiment 4

Figure 4:
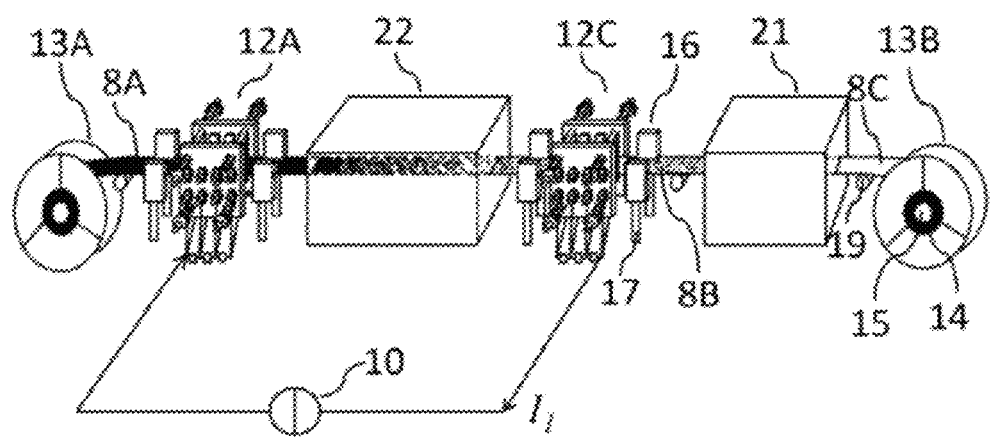
FIG. 4 illustrates the 3D structure and circuit of the embodiment 4 of the invention herein.
Figure 5:
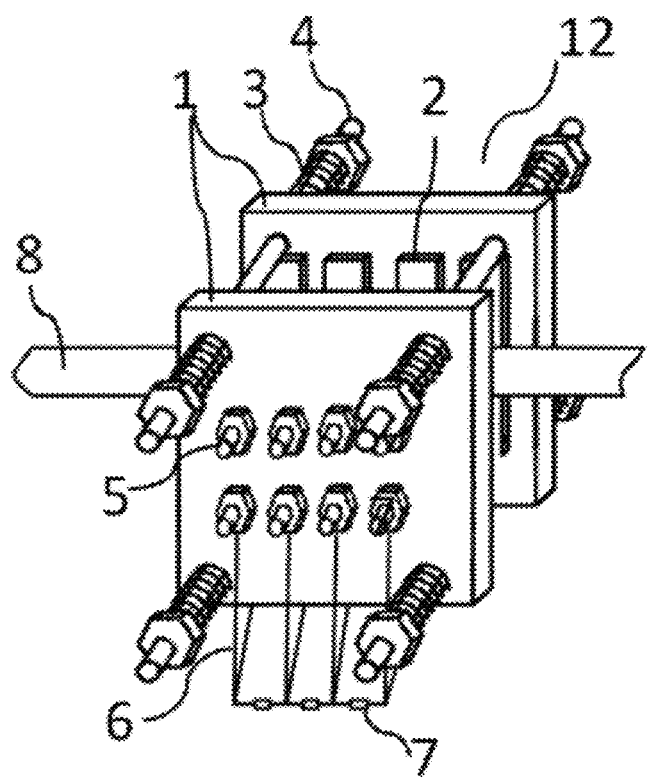
FIG. 5 illustrates the 3D structure of the electrode configuration referred in the invention herein.
Figure 6:
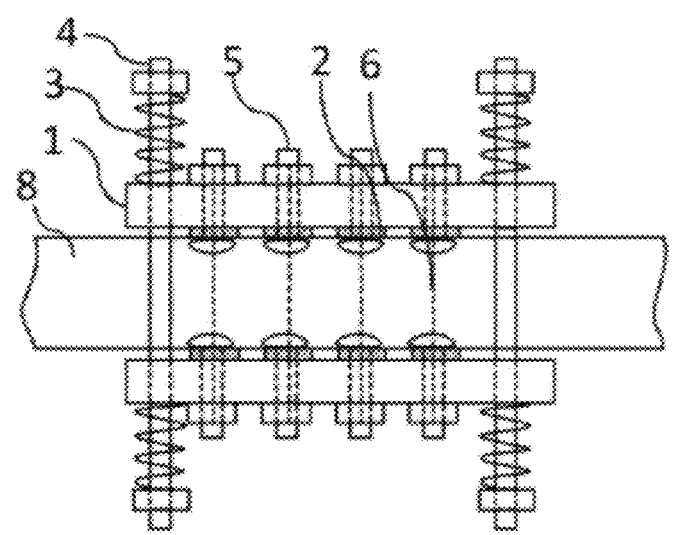
FIG. 6 is the top down view of the electrode configuration shown in FIG. 5.

As what is shown in FIG. 4, at working state the substrate-heating setup is installed in the system, and the first and second electrode configurations, 12A and 12C are connected to the anode (or cathode) and cathode (or anode) of the current source 10, respectively. The metal tape 8, positioning setups 16 are installed by referring to the embodiment 1. The difference is that there is precursor-coating zone 21 between the second electrode configuration 12C and the roll 13B, and precursor-processing zone 22 between the first electrode configuration 12A and the second electrode configuration 12C. In the precursor-coating zone 21, the precursor to form thin film is coated on the metal tape SC by the technique of metal organic deposition, solution planarization deposition, and so on. The precursor-processing zone 22 may be vacuumed or in the atmosphere. Similarly, one or more kinds of gas like $O_2$, Ar, $H_2$, $H_2O$, $N_2$ and so on, can also be introduced into the zone 22. When the precursor-coated metal tape 8B has gone into the preheated precursor-processing zone 22, the precursor forms the thin film after different kinds of chemical and/or physical changes. With referring to embodiment 3, one or more extra electrode configurations 12 can also be inserted to form multiple precursor-processing zones, thereby to achieve the sectional processing of the precursor-coated metal tape 8 with different temperatures or enclosures. Moreover, the rotation shaft 15 will drive the roll 13 to rotate, thereby brings the movement of the metal tape 8 among the precursor-coating zone 21, the electrode configurations 12 and the precursor-processing zone 22 to realize the continuous and reel-to-reel deposition of thin films on the metal tape 8.

Embodiment 5

The system shown in FIG. 1 can be employed to deposit the $2^{nd}$ generation high-temperature superconducting $YBa_2Cu_3O_{7-x}$ (YBCO) coated conductors. A 1 cm-width oxide-buffered hastelloy metal tape ($LaMnO_3$/homo-epi $MgO$/IBAD-$MgO$/SDP-$Y_2O_3$/Hastelloy) with its length longer than that of the growth zone was prepared, and the oxides on its edges were also sanded off. Then, this treated metal tape was welded end-to-end to a stainless steel tape. With referring to embodiment 1, the prepared metal tape was settled properly and the circuit was connected. Next, the growth chamber was vacuumed below 1 Pa, and the metal-organic solids of $Y(TMHD)_3$, $Ba(TMHD)_2$ and $Cu(TMHD)_2$ (TMHD: 2,2,6,6-tetramethyl-3,5-heptanedionate) with its weight of 120 mg, 230 mg and 210 mg, respectively, were dissolved together into 3 mL tetrahydrofuran solvent by ultrasonic vibration to form homogeneous and clear precursor solution. Then, the current source 9 was turned on to supply 26 A electricity (corresponding to voltage of 11.4 V) to heat the metal tape, and the temperature was monitored by a thermocouple. Then, the metal tape was dragged to the growth zone by the electric motor. After the temperature had been stable, the precursor solution was pumped by a peristaltic pump into an evaporator with temperature of 300° C. and transformed to gas. The gas was then delivered by the carrier gas of 70 Pa argon to be mixed with 70 Pa oxygen and 20 Pa $N_2O$. Then, the mixed gas passed through a 320° C. pipe and was sprayed by a showerhead to the metal tape surface in the growth zone to form YBCO film. The thickness of the deposited YBCO film was around 1.5 μm.

Figure 10:
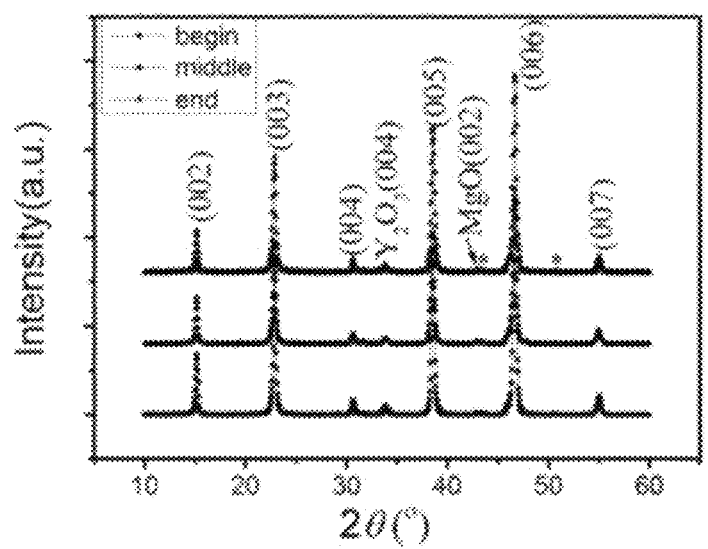
FIG. 10 shows the X-ray 2theta scans of $YBa_2Cu_3O_{7-x}$ (YBCO) films deposited on three different positions (beginning, middle and end) of the metal tape substrate. It's revealed that the YBCO films at three positions are all c-axis oriented and highly crystallized, demonstrated by the sharp (00l) peaks rather than (h00) peaks, and are also uniform because of the similar intensity of their (00l) peaks.
Figure 11:
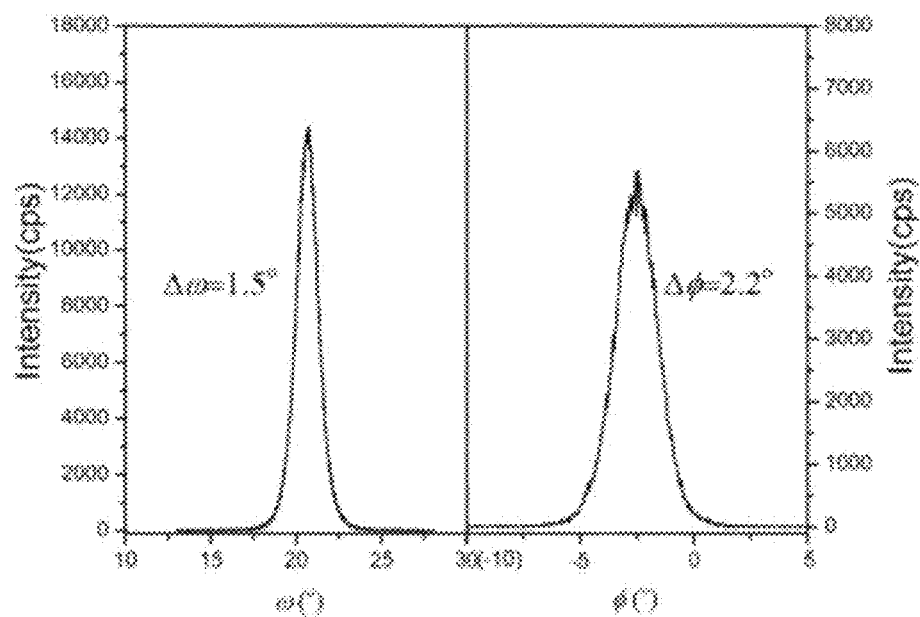
FIG. 11 shows the X-ray ω scan and Φ scan of YBCO film deposited on the middle of the metal tape substrate. The full width at half maximum (FWHM) of ω-scan curve and Φ-scan curve is 1.5° and 2.2°, respectively, indicating that the YBCO film is of excellent in-plane and out-of-plane textures, and is similar with the YBCO film deposited on single crystal substrate.
Figure 12:
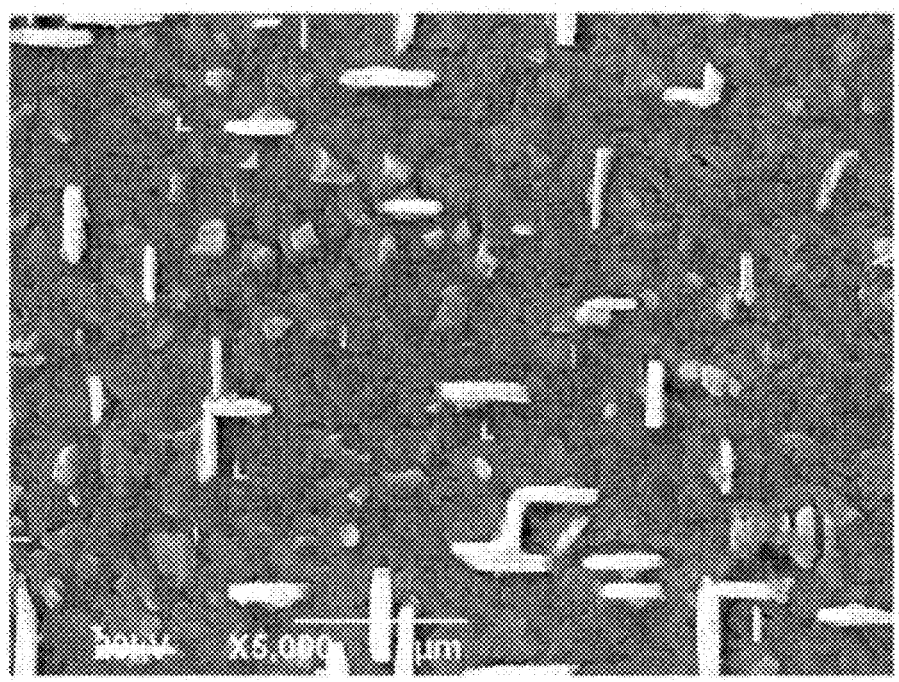
FIG. 12 shows the scanning electron microscope (SEM) image of YBCO film deposited on the middle of the metal tape substrate. It's shown that the film is smooth, dense and crack free with few a-axis oriented YBCO grains on its surface.

Then, the deposited YBCO film was placed into a tube furnace filled with 1 atm. $O_2$ and annealed at 500° C. for 30 minutes. The annealed YBCO film was characterized, and the corresponding texture and microstructure results were shown in FIG. 10-12. It was shown that the prepared YBCO films crystallized well and were of excellent texture, smooth and dense surface, and were crack free. The critical current density ($J_c$) at 77 K and self-field of the YBCO films at the beginning, middle and end of the sample is 1.2 $MA/cm^2$, 1.07 $MA/cm^2$ and 1.07 $MA/cm^2$, respectively, corresponding to the critical current of 180 A/cm, 160 A/cm and 160 A/cm. The above results indicated that the method and the system in the invention herein could achieve the fabrication of homogeneous and high-performance YBCO films on metal tapes.

What is claimed is:

1. A thin film deposition system, comprising a growth chamber, two substrate-rolling setups and a substrate-heating setup; wherein the substrate-heating setup comprises a first electrode configuration and a second electrode configuration, which are side by side installed between two rotation shafts in the growth chamber; and a space between the two electrode configurations is a growth zone of the thin film;
    wherein the first electrode configuration comprises an interface to a current source and at least two first substrate-contacting electrode strips; the two first substrate-contacting electrode strips are distributed along a first edge and a second edge of a substrate passage respectively and electrically connected with each other as well as the current source; and the two first substrate-contacting electrode strips are disposed on a same plane of the substrate passage; the substrate passage is configured for a metal tape substrate disposed therein;
    wherein the second electrode configuration comprises an interface to the current source and at least second two substrate-contacting electrode strips; the two second substrate-contacting electrode strips are distributed along the first edge and the second edge of the substrate passage respectively and electrically connected with each other as well as the current source; and the two second substrate-contacting electrode strips are disposed on the same plane of the substrate passage;
    and a plurality of currents are conduct into the first edge of the substrate passage and out of the second edge of the substrate passage through the first electrode configuration and the second electrode configuration when the metal tape substrate is disposed on the substrate passage;
    wherein at least two positioning setups are disposed at the entrances and exits of the first electrode configuration and the second electrode configuration respectively;
    wherein the positioning setup comprises two face-to-face positioning plates, a concavity to determine a substrate position is disposed on each of positioning plates; and a first edge and a second edge of the metal tape substrate are disposed in the concavity accordingly.

2. The thin film deposition system according to claim 1, wherein the first electrode configuration further comprises a current-distributing circuit and at least two electrode units, each of which includes two substrate-contacting electrode strips fixed along the first edge and the second edge of the substrate passage; and the electrode unit is connected electrically with each other through the current-distributing circuit; and
    the second electrode configuration is same with the first electrode configuration.

3. The thin film deposition system according to claim 2, wherein the substrate-contacting electrode strips are perpendicular to the substrate passage.

4. The thin film deposition system according to claim 2, wherein the first electrode configuration comprises at least three electrode units, and the current-distributing circuit is a serial connection of resistors; each electrode unit is parallel connected to its adjacent resistor; the second electrode configuration is same with the first electrode configuration.

5. The thin film deposition system according to claim 1, wherein each of the first electrode configuration and the second electrode configuration further comprises a first settlement configuration contains a position-adjusting configuration.

6. The thin film deposition system according to claim 5, wherein the settlement configuration contains a first electrode settlement configuration and a second electrode settlement configuration;
the first electrode settlement configuration comprises headless screws and two parallel and insulated plates; the insulated plates are installed in the growth chamber by the headless screws; an interspace between the two insulated plates is substrate passage; and the position-adjusting configuration is connected to the insulated plates;
the second electrode settlement configuration is same with the first electrode settlement configuration.

7. The thin film deposition system according to claim 6, wherein the position-adjusting configuration, comprises at least three screws, screw nuts and springs; the screws pass through holes on the two insulated plates and make them face to face with each other; the coupling of the screws and the holes is a slip fit; the screw nuts are settled on a part of the screws outside the insulated plates, and the springs are settled between outside faces of the insulated plates and the screw nuts; the substrate-contacting electrode strips are fixed on inner faces of the insulated plates.

8. The thin film deposition system according to claim 6, wherein there are at least three uniformly-spaced substrate-contacting electrode strips arranged on each of the insulated plates.

9. The thin film deposition system according to claim 1, wherein one or more extra electrode configuration can be placed between the first and second electrode configuration; the extra electrode configuration comprises at least two substrate-contacting electrode strips distributed along the first edge and the second edge of the substrate passage and an interface to current source; the extra electrode configuration is settled in the growth chamber through a settlement configuration of the extra electrode configuration; a thin film deposition zone locates between two adjacent electrode configurations.

10. The thin film deposition system according to claim 9, wherein the growth zone comprises a first growth zone and a second growth zone, the first growth zone is formed between the first electrode configuration and the extra electrode configuration, and the second growth zone is formed between the extra electrode configuration and the second electrode configuration.

11. The thin film deposition system according to claim 1, wherein the two substrate-rolling setups comprises a first substrate-rolling setup and a second substrate-rolling setup, and the first substrate-rolling setup comprises a first roll and a first rotation shaft for rotating the first roll, and the second substrate-rolling setup comprises a second roll and a second rotation shaft for rotating the second roll.

12. The thin film deposition system according to claim 11, wherein each of the two substrate-rolling setups further comprises a supporting roller between the roll and the adjacent electrode configuration.

13. The thin film deposition system according to claim 11, wherein a precursor-coating zone is formed between the second electrode configuration and the second roll.

14. The thin film deposition system according to claim 1, wherein a precursor-processing zone is formed between the first electrode configuration and the second electrode configuration.

15. The thin film deposition system according to claim 1, wherein a deposition source is directly disposed above a first surface of the metal tape substrate in the growth zone.

16. The thin film deposition system according to claim 1, wherein a deposition source is directly disposed above a first surface and a second surface of the metal tape substrate in the growth zone.

17. A method for fabricating thin films by using a thin film deposition system, wherein the thin film deposition system comprise a growth chamber, two rotation shafts for substrate payout and take-up rolls, and a substrate-heating setup; wherein the substrate-heating setup comprises two electrodes configurations, a first electrode configuration and a second electrode configuration, which are side by side installed between two rotation shafts in the growth chamber; and a space between the two electrode configurations is a growth zone of the thin film;
wherein the first electrode configuration comprises an interface to a current source and at least two first substrate-contacting electrode strips; the two first substrate-contacting electrode strips are distributed along a first edge and a second edge of a substrate passage and electrically connected with each other as well as the current source; and two the first substrate-contacting electrode strips are disposed on a same plane of the substrate; the substrate passage is configured for a metal tape substrate disposed therein;
wherein the second electrode configuration consists of an interface to the current source and at least two second substrate-contacting electrode strips; the two second substrate-contacting electrode strips are distributed along the first edge and the second edge of the substrate passage and electrically connected with each other as well as the current source; and the two second substrate-contacting electrode strips are disposed on the same plane of the substrate;
and a plurality of currents are conduct into the first edge of the substrate passage and out of the second edge of the substrate passage through the first electrode configuration and the second electrode configuration when the metal tape substrate is disposed on the substrate passage;
wherein at least two positioning setups are disposed at the entrances and exits of the first electrode configuration and the second electrode configuration respectively; and
wherein the positioning setup comprises two face-to-face positioning plates, a concavity to determine a substrate position is disposed on each of positioning plates; and a first edge and a second edge of the metal tape substrate are disposed in the concavity accordingly;
wherein the method comprises the following steps: 1) heating the metal tape substrate, and 2) depositing thin films, wherein in the step 1) a current is conducted into the metal tape substrate at one end of the growth zone by one electrode, and out of the metal tape substrate at the other end of the growth zone by the other electrode, so that the metal tape substrate is heated by the heat emitting of the resistant of the metal tape substrate itself.

18. The method for fabricating thin films according to claim 17, wherein the current is conducted into and out of the metal substrate through its edges.

* * * * *